(12) United States Patent
Jandt et al.

(10) Patent No.: US 10,750,608 B2
(45) Date of Patent: Aug. 18, 2020

(54) LOGIC-TO-CHASSIS PRINTED CIRCUIT BOARD (PCB) BOLT AND WASHER ASSEMBLY

(71) Applicant: International Business Machines Corporation, Armonk, NY (US)

(72) Inventors: Tyler Jandt, Rochester, MN (US); Timothy L. McMillan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/224,364

(22) Filed: Dec. 18, 2018

(65) Prior Publication Data

US 2020/0196436 A1 Jun. 18, 2020

(51) Int. Cl.
*H05K 1/02* (2006.01)
*H02K 1/18* (2006.01)
*H05K 1/18* (2006.01)

(52) U.S. Cl.
CPC ......... *H05K 1/0215* (2013.01); *H05K 1/0271* (2013.01); *H05K 1/182* (2013.01); *H05K 2201/10409* (2013.01)

(58) Field of Classification Search
CPC .... H05K 1/0215; H05K 1/182; H05K 1/0271; H05K 2201/10409
See application file for complete search history.

(56) References Cited

U.S. PATENT DOCUMENTS

| | | | |
|---|---|---|---|
| 4,943,247 A * | 7/1990 | Wise | H01R 4/34 439/883 |
| 6,019,614 A | 2/2000 | Baur et al. | |
| 6,295,210 B1 | 9/2001 | Lanzone et al. | |
| 6,493,233 B1 | 12/2002 | De Lorenzo et al. | |
| 7,028,389 B2 | 4/2006 | Chang | |
| 7,094,076 B2 | 8/2006 | Hatakeyama | |
| 9,451,698 B2 | 9/2016 | Kawabata et al. | |
| 2011/0255250 A1* | 10/2011 | Dinh | G03B 15/03 361/749 |
| 2017/0171960 A1* | 6/2017 | Yang | H05K 1/0215 |

FOREIGN PATENT DOCUMENTS

EP  0332909 A2  9/1989

OTHER PUBLICATIONS

Weston, D.A., "A technique for grounding a PCB to a conductive enclosure", PCBGRND.rep , Jun. 18, 2004.

* cited by examiner

*Primary Examiner* — Rockshana D Chowdhury
(74) *Attorney, Agent, or Firm* — Patterson + Sheridan, LLP

(57) ABSTRACT

An apparatus includes a printed circuit board (PCB) having a top surface, where the top surface includes a mounting aperture, a chassis, and a fastener having a width and length extending at least from the top surface of the PCB to the chassis through the mounting aperture. The apparatus also may include a logic ring that includes a via to a logic circuit of the PCB and a washer including a substantially flat surface including a high yield strength material. The washer may include a through-hole to accommodate the width of the fastener. The washer may additionally include a plurality of contact fingers extending out from the through-hole. The plurality of contact fingers is configured to contact the logic ring. The washer may be made to be in electrical communication with the chassis when compressed in response to a downward force from the fastener.

20 Claims, 6 Drawing Sheets

LOGIC-TO-CHASSIS PRINTED CIRCUIT BOARD (PCB) BOLT AND WASHER ASSEMBLY

BACKGROUND

The present invention pertains to a fixing device and, in particular, to a fixing device that fixes a printed circuit board (PCB) onto a chassis shell.

Mounting holes are provided in printed circuit boards (PCBs) to secure the PCBs to the computer system chassis in which they are mounted. Typically, a PCB will be secured to a chassis using threaded fasteners, which are inserted into threaded holes or press-in threaded barrels. Due to the brittle nature of the plastic material of PCBs, a top surface of the PCB can be crushed or otherwise damaged by the compression. The structural damage can harm logic circuits in layers of the PCB.

SUMMARY

According to one embodiment of the present invention, an apparatus includes a printed circuit board (PCB) having a top surface. The top surface includes a mounting aperture, a chassis, and a fastener having a width and length extending at least from the top surface of the PCB to the chassis through the mounting aperture. The apparatus also may include a logic ring comprising a via to a logic circuit of the PCB and a washer comprising a substantially flat surface comprising a high yield strength material. The washer may include a through-hole to accommodate the width of the fastener. The washer may additionally include a plurality of contact fingers extending out from the through-hole. The plurality of contact fingers is configured to contact the logic ring. The washer may be made to be in electrical communication with the chassis when compressed in response to a downward force from the fastener.

According to another specific implementation, a method of manufacturing a printed circuit board (PCB) includes forming a mounting aperture in a top surface of the PCB, providing a logic ring on the top surface of the PCB, wherein the logic ring includes a via to a logic circuit of the PCB, positioning a washer proximate the top surface of the PCB, wherein the washer includes a substantially flat surface comprising a high yield strength material, the washer including a through-hole to accommodate a width of a fastener, the washer including a plurality of contact fingers extending out from the through-hole, wherein the plurality of contact fingers are configured to contact the logic ring. The washer may be made to be in electrical communication with the chassis when compressed in response to a downward force from the fastener. The method additionally includes fastening the fastener to a chassis through the through-hole and the mounting aperture.

A particular embodiment includes an apparatus comprising a logic contact including an electrical contact and a washer comprising a substantially flat surface comprising a high yield strength material, the washer. The washer may include a plurality of contact fingers extending out from a center point. The plurality of contact fingers is configured to electrically contact the logic. The washer may be made to be in electrical communication with a ground when compressed.

DETAILED DESCRIPTION

Figure 1:
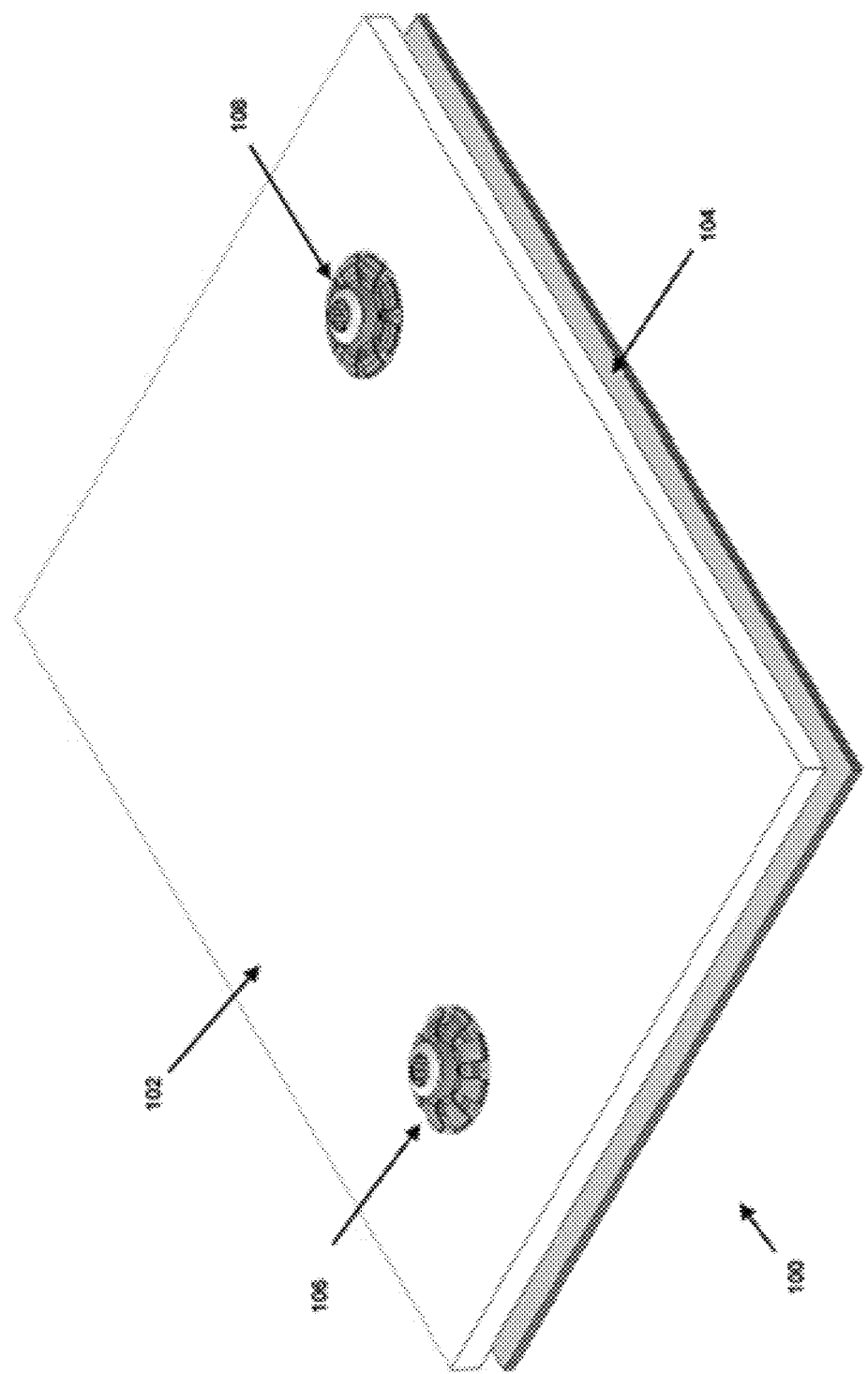
FIG. 1 is perspective view of an embodiment of a fastener and washer assembly system.

An embodiment of a system includes a screw and spring steel washer mounting hole design to make a logic-to-chassis connection. The connection may use a logic ring around a mounting hole chassis ring. A washer may include spring steel with radial contact fingers to contact the logic ring. The washer may be mechanically fixed to a fastener, such as a mounting hole screw. The mounting hole screw may make the chassis connection to complete the logic-to-chassis electrical connection. The spring steel washer design may communicate minimal stress to a printed circuit board (PCB). The system may include a contact wiping action and sufficient force to maintain the electrical connection over time.

An embodiment of the system may ground the board to the chassis, while maximizing a number of vias in the logic ring. Allowing a large number of vias in the logic ring may provide multiple logic-to-chassis connections at the mounting hole. The plurality of connections may reduce connection impedance. Because the spring style washer may not clamp down on the logic ring, logic planes may be layered in the region of the connection. An embodiment of the system may reduce the internal layer crush issue by not applying too much force, while the spring style washer enables grounded connection to the logic ring while not applying too much force. The embodiments of the system may in this manner limit impedance while not crushing layers of the PCB.

A particular embodiment uses a logic ring outside a mounting hole chassis ring. A screw, bolt, or other fastener may be used with a washer to make logic-to-chassis connection. In an implementation, the conductive fastener may isolate the logic-to-chassis using just the screw or other fastener.

A particular embodiment includes a screw and a spring steel washer design that provides a ground to the PCB via a logic-to-chassis connection at PCB mounting holes. The ground is provided with minimal structural stress to the layers of the PCB. The screw and washer assembly may use both a mounting hole chassis ring and a logic ring having vias to the logic layers. The washer may include spring steel with radial contact fingers to contact the logic ring (e.g., when compressed). The washer may be mechanically attached or integral with the mounting hole screw. The screw may make the chassis connection to complete the logic-to-chassis connection. The spring steel washer design may communicate a low level of stress to the PCB, relative to a conventional washer.

The washer may provide a contact wiping action. Wiping action contacts may be self-cleaning contacts that wipe or slide against each other when opening or closing a circuit. This wiping action helps prohibit the build-up of any nonconductive deposits on the contacts. The wiping action may be provided while the system additionally provides enough force to maintain electrical connection over time.

The spring steel washer may include radial fingers that wipe and connect to the outer logic ring on the PCB at designated mounting holes. Because the assembly does not apply stress to the PCB, more mounting holes and grounding points (e.g., fasteners) may be included to reduce EMI. Put another way, the attached screws connect to the inner chassis ring on the PCB to make electrical connections multiple times for high frequency lower impedance.

Spring steel may include a wide range of steels having high yield strength. These steels are generally low-alloy manganese, medium-carbon steel or high-carbon steel. Yield strength is the material property defined as the stress at which a material begins to deform plastically whereas yield point is the point where nonlinear (i.e., elastic and plastic) deformation begins. Prior to the yield point the material will deform elastically and will return to its original shape when the applied stress is removed. This property allows objects made of spring steel to return to their original shape despite significant deflection or twisting.

Use of a screw may make it easier to take apart to perform modifications or repairs. The screw and washer assembly may allow designers to include a contact with a chassis wherever a connection is desired. A conventional washer with the screw could apply too much pressure to a surface of the PCB. Subsequent damage to the layers below could include fractured wire routing.

The screw and inner grounding ring may be coupled to the chassis and may provide a ground connection. The inner grounding ring may be positioned outside of the mounting hole. When in a compressed position (e.g., when the fastener is engaged), the washer may connect the inner grounding ring to the outer logic ring and its associated vias.

The washer may be made from spring steel or another material having high yield strength. Extensions, or fingers, of the washer may be radial to more evenly spread out for wiping considerations. The washer may apply enough pressure to keep oxidation away, but not enough to damage the PCB surface. To this end, the ends of the washer extensions may be curved upwards to avoid scratching of the PCB surface.

Now turning more particularly to the Drawings, FIG. 1 is perspective view of an embodiment of a fastener and washer assembly system 100. The system 100 may include a PCB 102 that is fastened to a chassis 104 via fastener and washer assemblies 106, 108.

Figure 2:
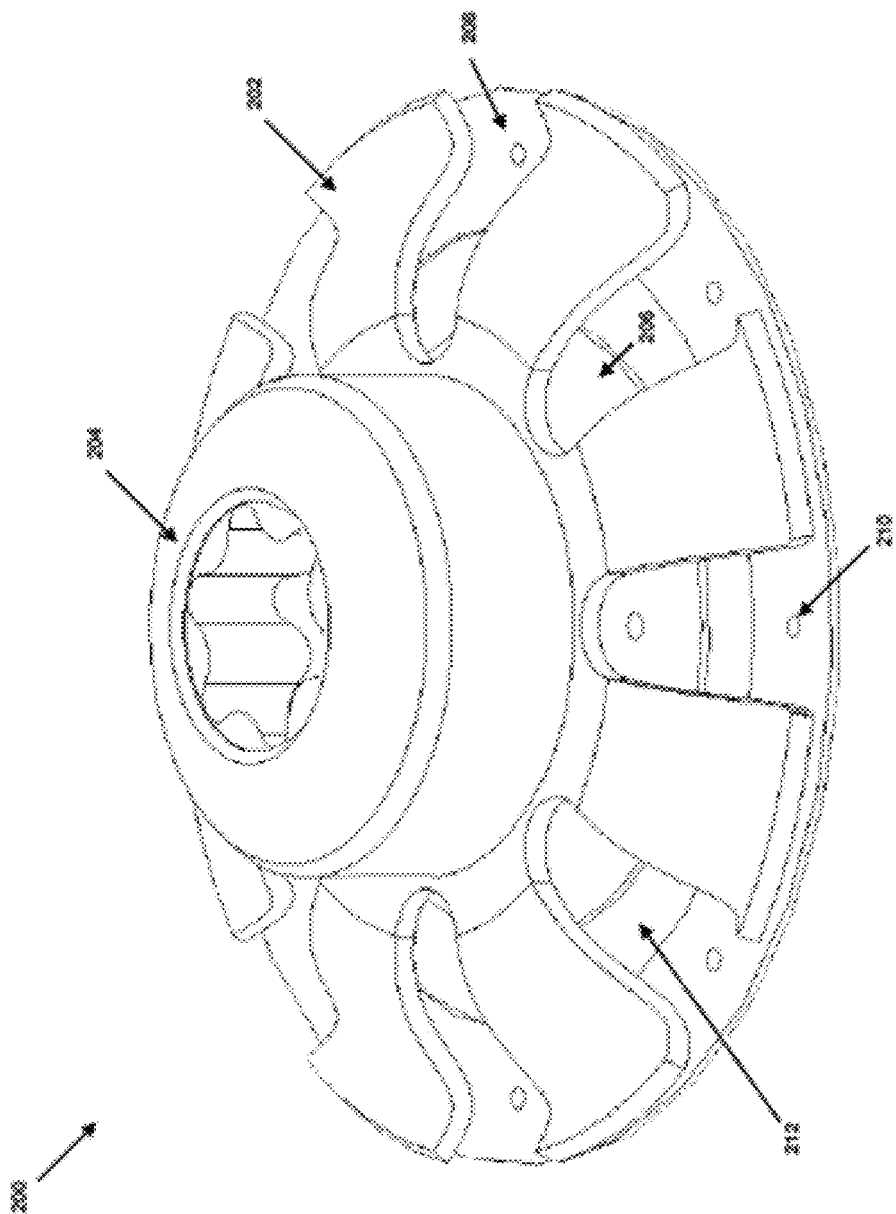
FIG. 2 is a close-up, perspective view of an embodiment of a fastener and washer assembly system, such as is shown in FIG. 1.

FIG. 2 is a close-up, perspective view of an embodiment of a fastener and washer assembly system 200, such as is shown in FIG. 1. The system 200 includes a washer 202 that is in an uncompressed state. Also shown is a fastener 204, such as a screw, as well as a grounding ring 206 that is positioned below the fastener 204 and the washer 202. When in an uncompressed state, the washer 202 may not make contact (e.g., an electrical connection) with the conductive inner grounding ring 206. Like the mounting hole ring 206, a logic ring 208 may include vias 210 to logic circuitry within the PCB 212. As with the washer 202, the fastener 204, and the mounting hole ring 206, the logic ring 208 may have conductive properties.

The screw fastener 204 and the inner grounding ring 206 may be coupled to the chassis (not shown) and may provide a ground connection. The inner grounding ring 206 may be positioned concentrically with respect to the grounding ring 206. When in a compressed position (e.g., when the fastener 204 is engaged), the washer 202 may connect the grounding ring 206 to the outer logic ring 208 and its associated vias 210.

Figure 3:
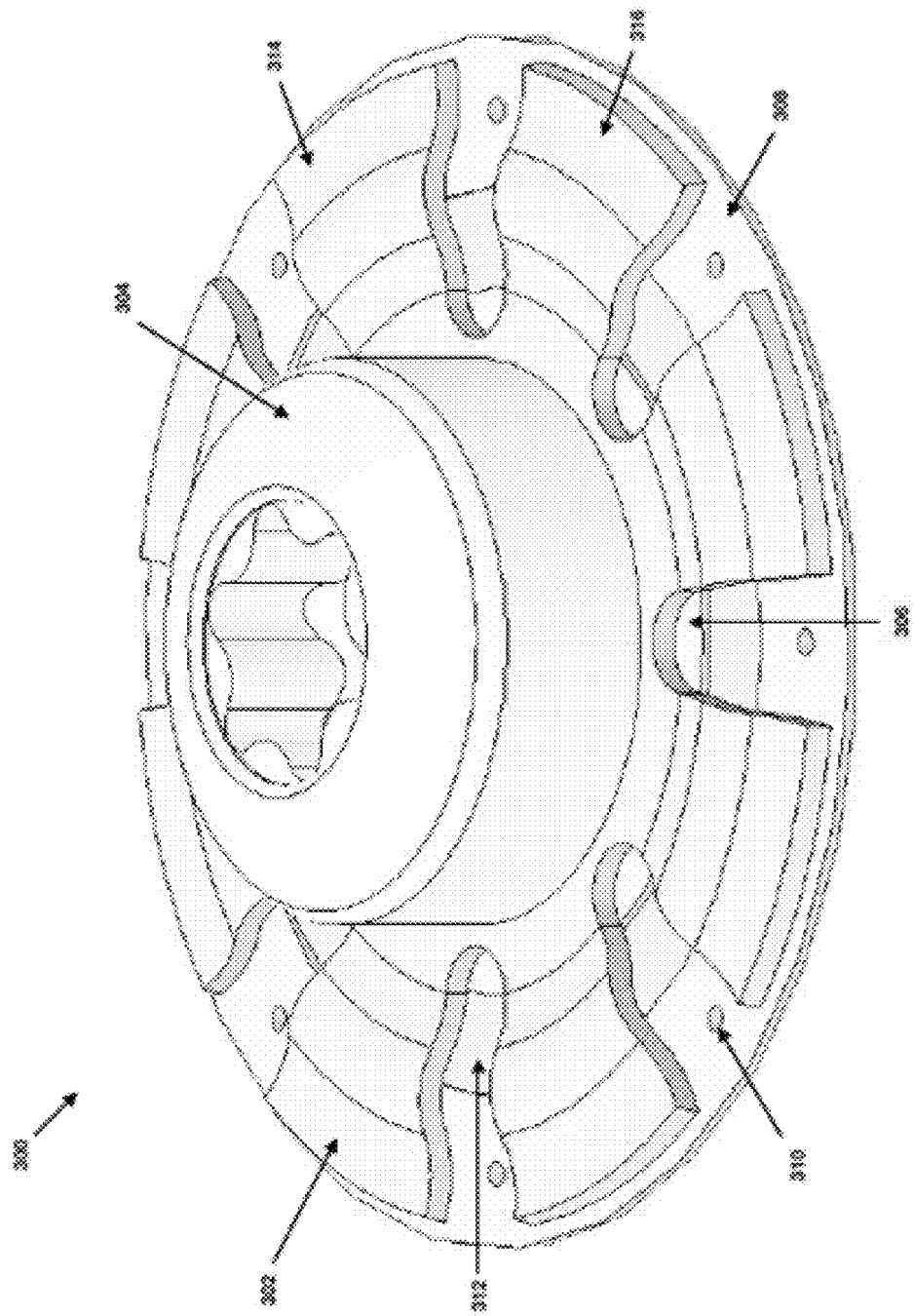
FIG. 3 is a close-up, perspective view of an embodiment of a fastener and washer assembly system, such as is shown in FIG. 1, while in a compressed configuration.

FIG. 3 is a close-up, perspective view of an embodiment of a fastener and washer assembly system 300, such as is shown in FIG. 1, while in a compressed configuration. That is, the system 300 includes a washer 302 that is in a compressed state. Like the mounting hole ring 306, a logic ring 308 may include vias 310 to logic circuitry within the PCB 312. The washer 302 may be compressed by a fastener 304 such that the washer 302 electrically contacts a grounding ring 306. The grounding ring 306 may be electrically grounded. As such, the fingers 314 of the washer 302 may ground the logic ring 308, vias 310, and associated logic layers of the PCB 312.

The washer 302 may be made from spring steel or another material having high yield strength. The fingers 314 of the washer 302 may be radial to more evenly spread out for wiping considerations on surface of the logic ring 306. The washer 302 may apply enough pressure to keep oxidation away, but not enough to damage the PCB surface. To this end, the ends 316 of the washer fingers 314 may be curved upwards to avoid scratching the surface of the PCB 312. While the fingers 314 in FIG. 2 contact the logic ring 306 in an uncompressed state, fingers of another embodiment may reach out and extend to only touch the logic ring when the washer is depressed.

Figure 4:
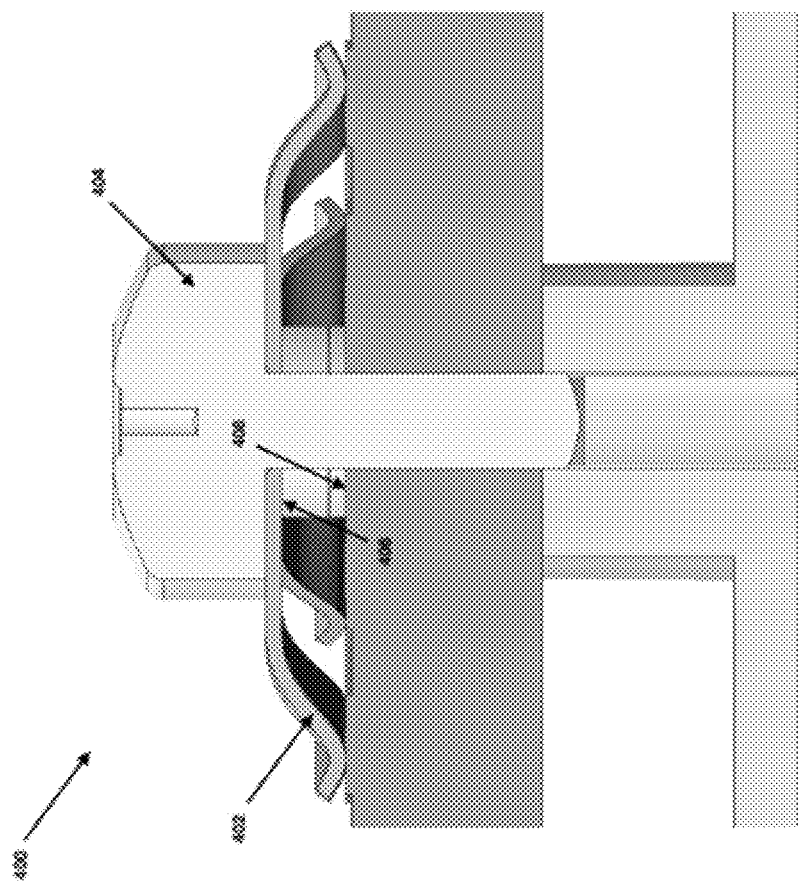
FIG. 4 is a cross-sectional view of an embodiment of a fastener and washer assembly system, such as is shown in FIG. 1, while in an uncompressed state.

FIG. 4 is a cross-sectional view of an embodiment of a fastener and washer assembly system 400, such as is shown in FIG. 1, while in an uncompressed state. Namely, system 400 includes a washer 402 that is in an uncompressed state. A fastener 404 is in an unsecured position. As discussed herein, the fastener 404 may be attached and grounded to a chassis (not shown). The washer 402 contacts the fastener 404 directly underneath the screw head and is thus grounded, itself. As shown in FIG. 4, a gap is present between a bottom surface 406 of the washer 402 and the PCB (e.g., grounding ring) surface 408.

Figure 5:
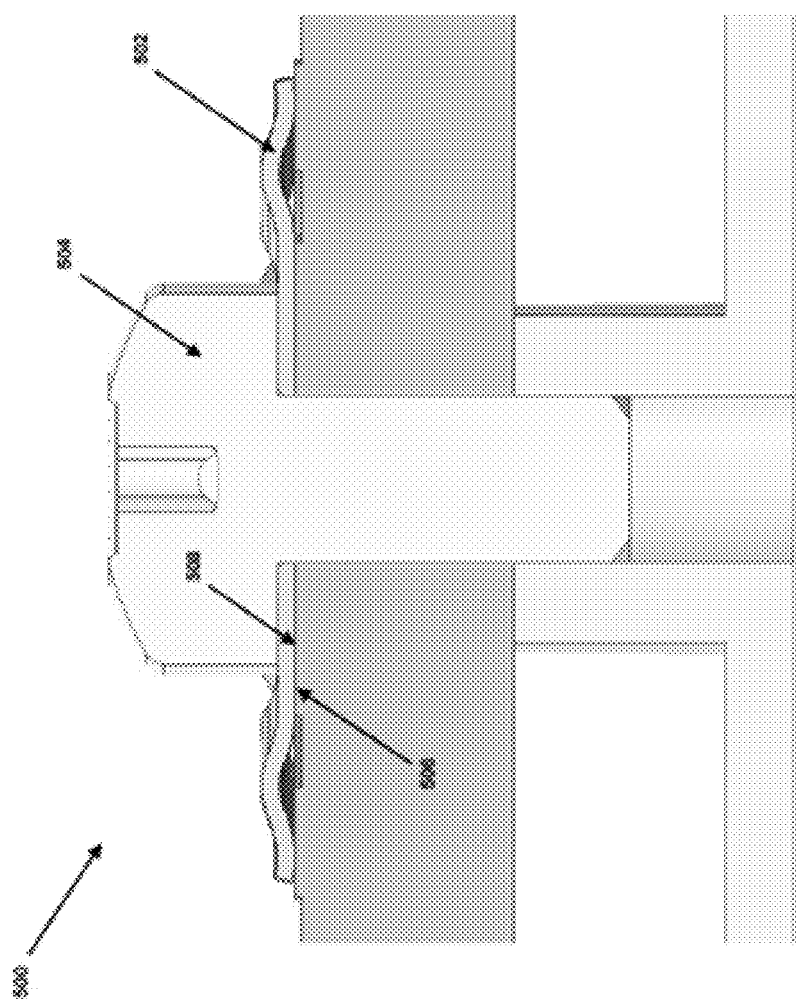
FIG. 5 is a cross-sectional view of a fastener and washer assembly system in a compressed state.

FIG. 5 is a cross-sectional view of a fastener and washer assembly system 500 in a compressed state. A fastener 504 is secured and has pushed the bottom surface 506 to be in contact with the surface 508 of the PCB (and grounding ring).

Figure 6:
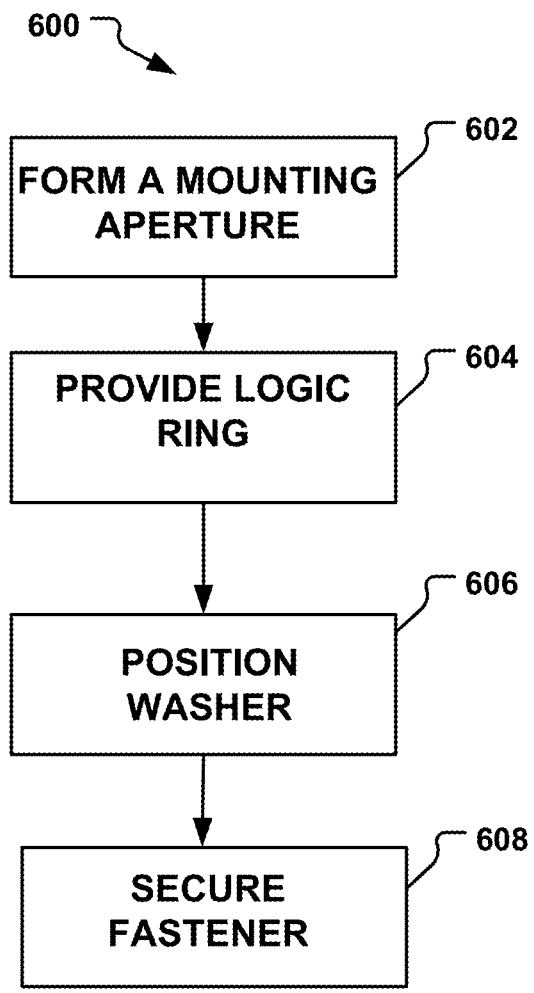
FIG. 6 is a flowchart of an embodiment of a method of manufacturing a PCB.

FIG. 6 is a flowchart of an embodiment of a method 600 of manufacturing a PCB that includes forming a mounting aperture in a top surface of the PCB at 602. At 604, the method includes providing a logic ring on the top surface of the PCB. The logic ring includes a via to a logic circuit of the PCB.

A washer may be positioned at 606 proximate the top surface of the PCB. The washer includes a substantially flat surface comprising a high yield strength material. The washer may include a through-hole to accommodate a width of a fastener, the washer including a plurality of contact fingers extending out from the through-hole. The plurality of contact fingers may be configured to contact the logic ring.

When the fastener is secured at 608, the washer is compressed in response to a downward force from the fastener. The washer may be grounded by virtue of contacting a chassis. The now grounded washer may provide a ground to the circuitry of the PCB through the logic rings and vias.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems and methods according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. An apparatus comprising:
    a printed circuit board (PCB) having a top surface, wherein the top surface includes a mounting aperture;
    a chassis;
    a fastener having a width and length extending at least from the top surface of the PCB to the chassis through the mounting aperture;
    a logic ring comprising a contact surface and a via to a logic circuit of the PCB; and
    a washer comprising a substantially flat surface comprising a high yield strength material, the washer including a through-hole to accommodate the width of the fastener, the washer including a plurality of contact fingers extending out from the through-hole, wherein the plurality of contact fingers initiate an electrical connection with the logic ring and slide along the contact surface of the logic ring in a wiping action when the washer is compressed in response to a downward force from the fastener to provide an electrical communication with the chassis.

2. The apparatus of claim 1, further comprising a grounding ring positioned on the top surface of the PCB and concentric around the mounting aperture.

3. The apparatus of claim 1, wherein the plurality of contact fingers extend out radially from the through-hole.

4. The apparatus of claim 1, wherein the material is spring steel.

5. The apparatus of claim 1, wherein an end of a contact finger of the plurality of contact fingers is curved upwards.

6. The apparatus of claim 1, wherein the washer may be mechanically attached to the fastener.

7. The apparatus of claim 1, wherein the fastener completes a logic-to-chassis electrical connection.

8. The apparatus of claim 1, wherein the washer provides force to maintain an electrical connection.

9. The apparatus of claim 1, wherein the via is one of multiple vias in the logic ring.

10. A method of manufacturing a printed circuit board (PCB), the method comprising:
    forming a mounting aperture in a top surface of the PCB;
    providing a logic ring on the top surface of the PCB, wherein the logic ring includes a contact surface and a via to a logic circuit of the PCB;
    positioning a washer proximate the top surface of the PCB, wherein the washer includes a substantially flat surface comprising a high yield strength material, the washer including a through-hole to accommodate a width of a fastener, the washer including a plurality of contact fingers extending out from the through-hole, wherein the plurality of contact fingers initiate an electrical connection with the logic ring and slide along the contact surface of the logic ring in a wiping action when the washer is compressed in response to a downward force from the fastener to provide an electrical communication with the chassis; and
    fastening the fastener to a chassis through the through-hole and the mounting aperture.

11. The method of claim 10, further comprising arranging the plurality of contact fingers to extend out radially.

12. The method of claim 10, further comprising forming the washer out of spring steel.

13. The method of claim 10, further comprising forming an end of a contact finger of the plurality of contact fingers to curve upwards.

14. The method of claim 10, further comprising attaching the washer to the fastener.

15. The method of claim 10, further comprising using the fastener to complete a logic-to-chassis electrical connection.

16. The method of claim 10, further comprising using the washer to provide force to maintain an electrical connection.

17. An apparatus comprising:
a logic contact including an electrical contact; and
a washer comprising a substantially flat surface comprising a high yield strength material, the washer including a plurality of contact fingers extending out from a center point, wherein the plurality of contact fingers initiate an electrical connection with the electrical contact and slide along a surface of the logic contact in a wiping action and form an electrical connection when the washer is compressed.

18. The apparatus of claim 17, wherein the material is spring steel.

19. The apparatus of claim 17, wherein an end of a contact finger of the plurality of contact fingers is curved upwards.

20. The apparatus of claim 1, wherein the washer may be mechanically attached to a fastener.

\* \* \* \* \*